United States Patent
Suzuki

[11] Patent Number: 6,107,676
[45] Date of Patent: Aug. 22, 2000

[54] LEADFRAME AND A METHOD OF MANUFACTURING A SEMICONDUCTOR DEVICE BY USE OF IT

[75] Inventor: Shinichi Suzuki, Kyoto, Japan

[73] Assignee: Rohm Co., Ltd., Kyoto, Japan

[21] Appl. No.: 09/044,156

[22] Filed: Mar. 19, 1998

[30] Foreign Application Priority Data

Mar. 21, 1997 [JP] Japan ................................. 9-067688

[51] Int. Cl.⁷ ................................. H01L 23/495
[52] U.S. Cl. .................... 257/666; 257/670; 257/674; 438/111
[58] Field of Search ................... 257/666, 670, 257/671, 674; 438/111, 112, 123

[56] References Cited

U.S. PATENT DOCUMENTS

| | | | |
|---|---|---|---|
| 4,701,781 | 10/1987 | Sankhagowit | 257/671 |
| 5,321,305 | 6/1994 | Sakamoto | 257/670 |
| 5,517,056 | 5/1996 | Bigler et al. | 257/670 |
| 5,729,049 | 3/1998 | Corisis et al. | 257/666 |

FOREIGN PATENT DOCUMENTS

| | | |
|---|---|---|
| 114531A1 | 8/1984 | European Pat. Off. . |
| 143441A2 | 6/1985 | European Pat. Off. . |
| 1372216 | 10/1974 | United Kingdom . |
| 2191892 | 12/1987 | United Kingdom . |
| 2202372 | 9/1988 | United Kingdom . |

*Primary Examiner*—Kevin M. Picardat
*Attorney, Agent, or Firm*—Arent Fox Kintner Plotkin & Kahn, PLLC

[57] ABSTRACT

A leadframe and a method of manufacturing a semiconductor device make it possible to manufacture easily and efficiently such small-size semiconductor devices as have many leads but rarely suffer from short circuits between the leads when mounted on a circuit board. To achieve this, in a leadframe having a plurality of leads, an island for mounting a semiconductor chip, and a tie-bar for joining the leads together, the leads are given bends at their intermediate positions so that the pitch with which they are arranged is greater in a region farther from the island than in a region closer thereto, and the tie-bar is formed between those bends and the island. After the semiconductor chip mounted on the island, together with the portion surrounding it, is sealed in in a resin mold, those portions of the tie-bar which come between the leads are removed by cutting them apart parallel to the side edges of the leads. A projection is formed in a side edge of the island, and this projection is pressed against the stage during wire-bonding.

20 Claims, 7 Drawing Sheets

LEADFRAME AND A METHOD OF MANUFACTURING A SEMICONDUCTOR DEVICE BY USE OF IT

BACKGROUND OF THE INVENTION

1. Field of the Invention

The present invention relates to a leadframe for mounting a semiconductor chip, and to a method of manufacturing a semiconductor device by use of such a leadframe.

2. Description of the Prior Art

A semiconductor chip has various devices and circuits, such as transistors, diodes, and integrated circuits (ICs), formed in it. Usually, a semiconductor chip is, in the last steps of its manufacture, fitted with as many leads as required and resin-molded for protection, so that it is at last made into a semiconductor device as an end product. In these steps, a leadframe is used. A leadframe is made of metal, and consists of a portion that is later made into individual leads and a portion on which a semiconductor chip is mounted. The portion for mounting the semiconductor chip is called the "island", and is formed at the tip-side end of one lead. The tip-side ends of the other leads are so formed as to come in the vicinity of the island.

On the top surface of the semiconductor chip, a plurality of bonding pads for input or output are provided that are connected to the circuits formed inside. The semiconductor chip is fixed on the island with adhesive, and is then connected to the tip-side ends of the leads by wire-bonding. Depending on the circuits formed inside, the semiconductor chip may be, for example, so constructed that terminals such as input, output, and power-supply terminals are drawn out from its bottom surface. A semiconductor chip of this type is fixed on the island with conductive adhesive and is at the same time electrically connected to one lead. In a semiconductor chip of the type that does not have terminals drawn out from its bottom surface, one bonding pad is in some cases connected to the peripheral part of the island with a wire.

A resin mold is formed so as to enclose the semiconductor chip, the island, and the tip-side ends of the leads. The portions of the leads that are enclosed in the mold are called the "inner leads", and their portions that are left outside the mold are called the "outer leads".

To enhance productivity, it is preferable, instead of performing the above steps (i.e. fixing the semiconductor chip on the island, connecting the semiconductor chip to the leads, and forming the resin mold) separately on individual semiconductor chips, to perform each step on a plurality of semiconductor chips successively or simultaneously. To achieve this, a leadframe usually has many sets of an island and leads arrayed at regular intervals. In such a leadframe, all the leads are joined together not only at their base-side ends, but also at intermediate positions between their base-side and tip-side ends. This is to prevent warping of the leadframe and variations in the lead-to-lead intervals. The portion that joins the leads together at their intermediate positions is called the "tie-bar".

FIG. 5 shows a conventional leadframe after the formation of resin molds. In FIG. 5, numeral 27 represents a resin mold, numerals 21a and 21b in combination represent an outer lead 21 of a lead 20, and numeral 23 represents a tie-bar. Note that no inner leads appear in the figure because they are enclosed in the resin molds. Note also that, in this figure, only part of the leadframe is shown, that is, its portions extending rightward and leftward as well as the base-side ends of the leads are omitted. In this example, one semiconductor device is given three leads 20.

The individual semiconductor devices are separated from one another by cutting apart the tie-bar 23 joining the leads 20 and cutting apart the outer leads 21 at their base-side ends. The outer leads 21 of a separated semiconductor device are, if necessary, bent so that they run along the external surface of the resin mold 27. A semiconductor device as an end product is mounted on a circuit board together with other components. In that case, the semiconductor device is firmly mounted on the circuit board by soldering the outer leads 21 of the former to the wiring pattern formed on the latter.

It is desirable that semiconductor chips and semiconductor devices be made as small as possible. Accordingly, the pitch between the inner leads (indicated by the letter A in FIG. 5) is made as small as possible. On the other hand, since mounting is achieved by use of solder, to prevent short circuits, the pitch between the outer leads 21 in their portions 21b farther from the island (indicated by the letter B in FIG. 5) needs to be made comparatively large. For this reason, not all the leads 20 are made linear, but at least those situated outside are so formed as to have bends.

A leadframe is formed by punching it out of a metal sheet into a desired shape. Conventionally, as shown in FIG. 5, to simplify the shape to be punched out, parts of the tie-bar 23 joining the leads 20 are used also as the bends 21c of the leads 20. As a result, the outer leads 21 have different pitches on the two sides of the tie-bar 23; that is, they have, in their portions 21a, a pitch equal to the pitch A of the inner leads and, in their portions 21b, a larger pitch B. FIG. 6 shows an enlarged view of the lead 20 after the tie-bar 23 has been cut apart. As shown there, only those parts of the tie-bar 23 which join adjacent leads are cut away, and the other parts are left behind as the bends 21c of the two outside leads.

For a semiconductor chip that requires as few as three leads, bends in its leads do not bring the larger-pitched portion 21b of one lead too close to the smaller-pitched portion 21a of the adjacent lead. Therefore, it is possible to cut apart the tie-bar 23 parallel to the side edges of the leads 20 and still secure sufficiently wide gaps between the leads there.

However, for a semiconductor chip that requires more leads, bends in its leads bring the larger-pitched portion of one lead too close to the smaller-pitched portion of the adjacent lead. FIG. 7 shows a leadframe that requires four leads, and FIG. 8 shows an enlarged view of its lead 20 after the tie-bar 23 has been cut apart. In this case, not only the two outside leads, but also the two inside leads have bends 21c, and the portions 21b of the two inside leads are brought close to the portions 21a of the two outside leads. Therefore, to secure as wide gaps as possible between the leads after the tie-bar 23 has been cut apart, it is necessary, as shown in FIG. 8, to cut apart the tie-bar 23 not parallel to the side edges of the leads 20 but obliquely thereto.

However, even if the tie-bar is cut apart obliquely, there is a limit to widening the gap between the leads there. In addition, oblique cutting requires very accurate positioning, and, unless sufficient positioning accuracy is secured, the gaps between the leads will no longer be uniform, that is, some gaps will be left smaller than desired. When a semiconductor device is mounted on a circuit board, gaps that are smaller than desired tend to readily cause adjacent leads to be brought into contact and thus short-circuited by solder, especially when solder is applied so profusely as to form swells.

To prevent short circuits between the leads, non-conductive resin is often applied to the surfaces of the leads at those positions where the tie-bar is cut apart, thereby to form non-conductive coatings. In the example shown in FIG. 8, non-conductive coatings are formed in the area enclosed by broken lines.

Forming non-conductive coatings at the positions where the tie-bar is cut apart is useful in securing insulation between the leads. However, the non-conductive coatings need to be formed after the tie-bar has been cut apart, that is, separately for individual semiconductor devices. This not only increases manufacturing steps but also greatly diminishes the productivity of semiconductor devices. In addition, in semiconductor devices such as light-emitting diodes, light-receiving ICs, and photointerruptors that employ photoelectric conversion devices, there is a possibility that the openings provided to let light in or out are erroneously filled up with the resin applied as non-conductive coatings when too much resin is applied.

Furthermore, to secure sufficient positioning accuracy in cutting the tie-bar obliquely, the leadframe needs to be produced with higher accuracy. Thus, for reasons as described hitherto, the structure of conventional leadframes has been curbing reduction of the manufacturing cost of semiconductor devices as well as improvement of their yield.

The fixing of the semiconductor chip on the island and the wire-bonding thereof are performed, with the leadframe placed on a flat stage, by pressing down the tie-bar-side portions of the inner leads from above with a pin. FIG. 9 shows the side view of the island during wire-bonding. In FIG. 9, numeral 31 represents an island, numeral 32 represents an inner lead, numeral 33 represents a semiconductor chip, numeral 34 represents a bonding pad, numeral 35 represents a wire, numeral 36 represents a stage, numeral 37 represents a capillary tool, and numeral 38 represents a pressing pin. Usually, the island 31 and the lead 32 are both placed in close contact with the top surface of the stage 36, and the semiconductor chip 33 is placed in close contact with the top surface of the island 31.

From this state, the capillary tool 37 is moved down so that the wire 35 protruding from its tip is pressed against the bonding pad 34 with force that is weak enough not to damage the semiconductor chip 33. Then, from the capillary tool 37, a supersonic wave is applied to the tip of the wire 35 and thereby the wire 35 is fixed to the bonding bad 34. Subsequently, the capillary tool 37 is moved to above the lead 32 and then down onto it so that the wire 35 is fixed to the lead 32 and then cut apart with force and a supersonic wave in a similar way.

However, since the island is farther than the tip of any lead from the tie-bar, the tip of the island tends to bend upward and come off the upper surface of the stage. In FIG. 9, the dash-and-dot lines show the state of the island 31 when its tip has come off the stage 36. In this state, it is impossible to fix the semiconductor chip 33 on the island 31 so that the former is placed in close contact with the latter, and thus it is impossible to obtain sufficient fitting strength.

In addition, if wire-bonding is performed with the tip of the island 31 off the stage 36, the island 31 bends freely during wire-bonding and thereby not only prevents the application of sufficient force to the wire 35, but also scatters around the supersonic wave. As a result, it is impossible to connect the wire 35 to the bonding pad 34 properly. Similarly, when the wire 35 is connected to the peripheral part of the island 31, it is impossible to secure proper connection between them.

To prevent such coming-off of the island 31, when the semiconductor chip is fixed on the island and is wire-bonded, it is customary to press down the tip of the island from above with another pin. In FIG. 9, numeral 39 represents such a pin that is used to press the tip of the island 31 against the stage 36. However, to accommodate this pin, the island 31 needs to have an area larger than is necessary to mount the semiconductor chip, and therefore the resin mold needs to be made accordingly larger. This inevitably makes the semiconductor device as an end product unduly large.

SUMMARY OF THE INVENTION

An object of the present invention is to provide a leadframe and a method of manufacturing a semiconductor device that make it possible to manufacture easily and efficiently such small-size semiconductor devices as have many leads but rarely suffer from short circuits between the leads when mounted on a circuit board.

To achieve the above object, according to one aspect of the present invention, in a leadframe comprising an island for mounting a semiconductor chip, a plurality of leads that have one end connected to or placed close to the island and that are arranged, in a first region nearer to the island, approximately parallel to each other with a first pitch between each other and, in a second region adjacent to the first region and farther from the island, approximately parallel to each other and with a second pitch greater than the first pitch between each other, and a tie-bar for joining the plurality of leads together, the tie-bar joins the plurality of leads in the first region.

At least one of the plurality of leads is connected to the island, and the others have one end placed in the vicinity of the island. These leads are arranged approximately parallel to each other, and the pitch with which they are arranged changes at one position along the length of the leads, that is, the leads are arranged with one pitch in a region nearer to the island and with another pitch greater than the first in a region farther from the island. The tie-bar joins the leads together in the region in which the pitch between the leads is smaller, that is, in the region nearer to the island than the position at which the pitch changes. Accordingly, the length of those parts of the tie-bar which come between adjacent leads depends only on the pitch between the leads in the region nearer to the island, regardless of how the lead pitch changes.

By cutting apart the tie-bar parallel to the side edges of the leads, it is possible to easily remove substantially all of those parts of the tie-bar which come between the leads. This helps make the lead pitch at the position where adjacent leads have originally been joined together by the tie-bar almost equal to the lead pitch elsewhere. As a result, there remains almost no possibility that adjacent leads are pressed into contact with each other by external force.

It is also possible to construct the above leadframe in such a way that the borderline between the first and second regions is approximately perpendicular to the plurality of leads and that the plurality of leads are bent on this borderline. To change the pitch between the leads at one position along their length, the leads are given bends. The bends of the leads come at an approximately equal distance from the island, that is, along a line. As a result, although the leads have a smaller pitch in their bent portions, the tie-bar joins them together somewhere else, and therefore it does not occur that the leads have an even smaller pitch in their bent portions after the tie-bar has been cut apart. Neither do these bends hamper the cutting-apart of the tie-bar. In addition, it is possible to make the leads shorter than in the construction where the leads are bent at different distances from the island.

It is also possible to construct the above leadframe in such a way that the plurality of leads are so arranged as to be symmetrical with respect to a line through the island except in their portions closer to the island than the tie-bar. This helps make symmetrical the lengths of the bent portions provided to change the lead pitch and thereby minimize the narrowing of the pitch between adjacent leads in their bent portions.

It is also possible to provide the above leadframe with a plurality of sets each comprising an island and a plurality of leads joined together with a tie-bar. This makes it possible to manufacture a number of semiconductor devices at a time.

According to another aspect of the present invention, a semiconductor device is manufactured by use of a leadframe as described above through the steps of: fixing a semiconductor chip that has bonding pads for input or output on its top surface on the island; connecting island-side ends of the plurality of leads, except the one that is connected to the island, to the bonding pads with wires; sealing in the semiconductor chip, the island, and the island-side ends of the plurality of leads in a resin mold; and removing those portions of the tie-bar which come between the plurality of leads by cutting them apart parallel to side edges of the plurality of leads. By cutting apart the tie-bar parallel to the side edges of the leads, it is possible to remove almost completely those parts of the tie-bar which come between the leads and thereby secure maximal gaps between the leads of the semiconductor device. In addition, the tie-bar can be cut apart easily.

To achieve the above object, according to still another aspect of the present invention, in a leadframe comprising an approximately square-shaped island for mounting a semiconductor chip, a first lead connected to a first side edge of the island and extending in a direction approximately perpendicular to the first side edge, and a plurality of second leads having their island-side end portions placed close to the island and extending approximately in the same direction as the first lead, the island has a projection in a second side edge of the island that is approximately parallel to said first lead.

When the semiconductor chip is fixed on the island or is wire-bonded, the projection can be used as a portion that is pressed down with a pin to prevent the coming-off of the island. The projection can be used also as a portion that is connected with a wire. Thus, the projection helps reduce the area of the island excluding the projection to a minimum that is required to mount the semiconductor chip.

Usually, part of the second leads are formed along the second side edge of the island. Accordingly, it is possible to make the width of the island including the projection, i.e. the length of the island along its first side edge, smaller than the distance between the two outermost ones of the second leads. Thus, providing a projection in a second side edge of the island does not affect the size of the resin mold, and therefore does not make the produced semiconductor device unduly large.

According to a further aspect of the present invention, a semiconductor device is manufactured by use of a leadframe as described above through the steps of: fixing a semiconductor chip that has bonding pads for input or output on its top surface on said island; placing said island and the island-side end portions of said second leads on a stage, with said projection pressed from above; and connecting said bonding pads to the island-side end portions of said second leads or to said projection with wires. This method allows the bonding pads to be connected securely to the leads with wires or the semiconductor chip to be connected securely to the island, and thus makes it possible to produce highly reliable semiconductor devices. In addition, since the size of the island can be minimized, it is possible to obtain compact semiconductor devices.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
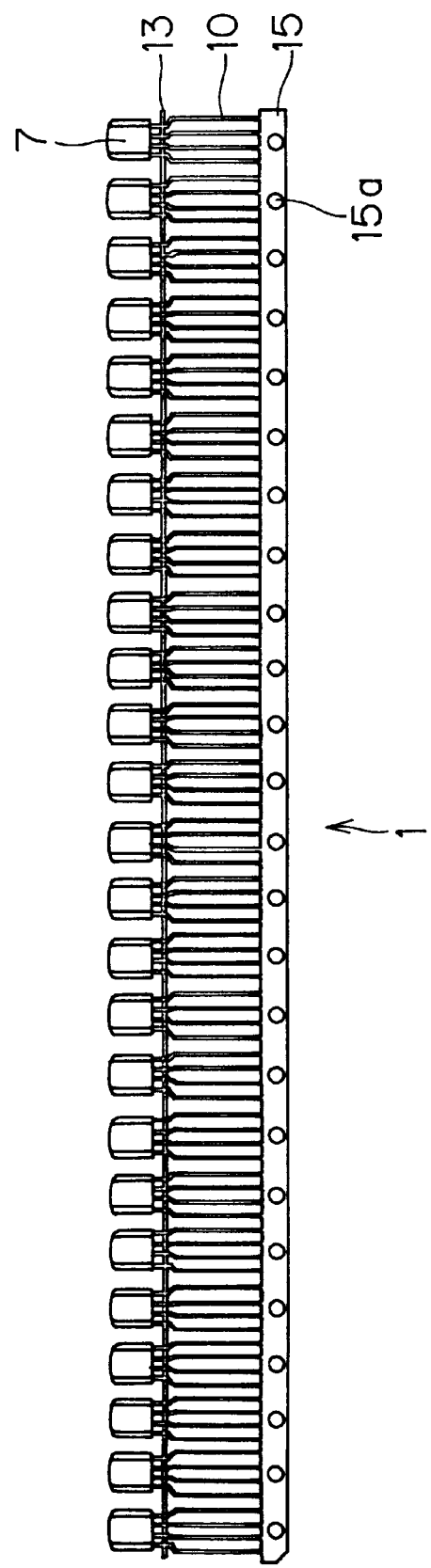
FIG. 1 is a diagram showing a leadframe embodying the present invention in its state after the formation of resin molds.

Hereinafter, embodiments of the present invention will be described with reference to the drawings. FIG. 1 shows a leadframe 1 embodying the invention, in its state after the formation of resin molds 7. The leadframe 1 is formed by removing unnecessary portions from a conductive metal sheet by punching or etching.

This leadframe 1 is used to fit a number of semiconductor chips with four leads each, and therefore has a number of groups of four strip-like leads 10. All the leads are arranged in the same orientation, and they are at their base-side ends joined together by a wide joining bar 15 provided perpendicularly to the leads. All the groups of leads are arranged regularly with a predetermined pitch, and, in the joining bar 15, through holes 15a are formed with the same pitch to mark the position of each group.

The tip-side ends of the leads 10 are enclosed in the resin mold 7, and all the leads 10 are joined together by a linear tie-bar 13 provided perpendicularly to the leads 10 at intermediate positions between their tip-side and base-side ends. The tie-bar 13 serves to reinforce the linkage between the leads 10 due to the joining bar 15 and thereby prevent warping of the leadframe 1 and variations in the intervals between the leads. The tie-bar 13 is not part of the leads 10, and therefore it is cut away later.

Figure 2:
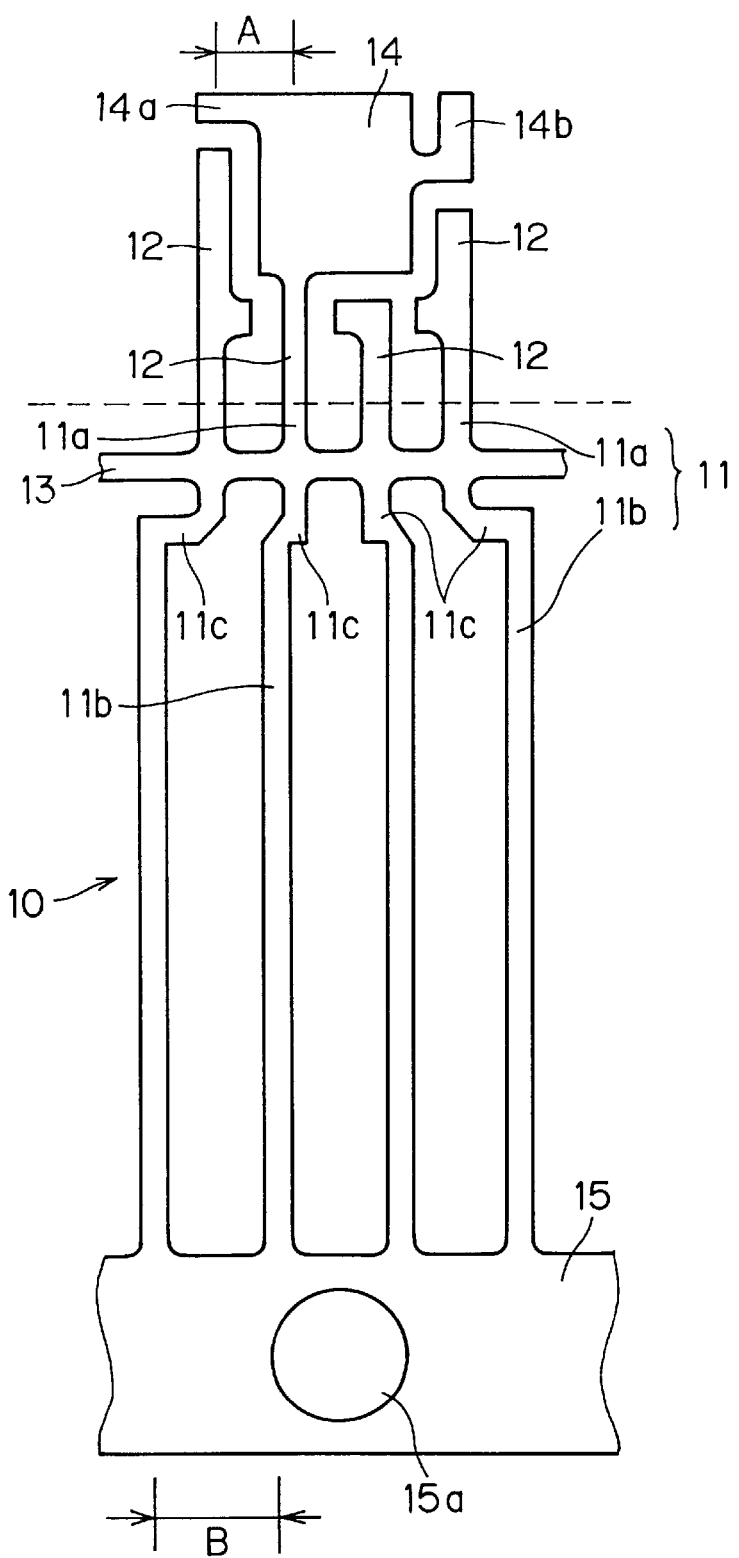
FIG. 2 is a diagram showing a part of the leadframe shown in FIG. 1 that corresponds to one semiconductor device.
Figure 3:
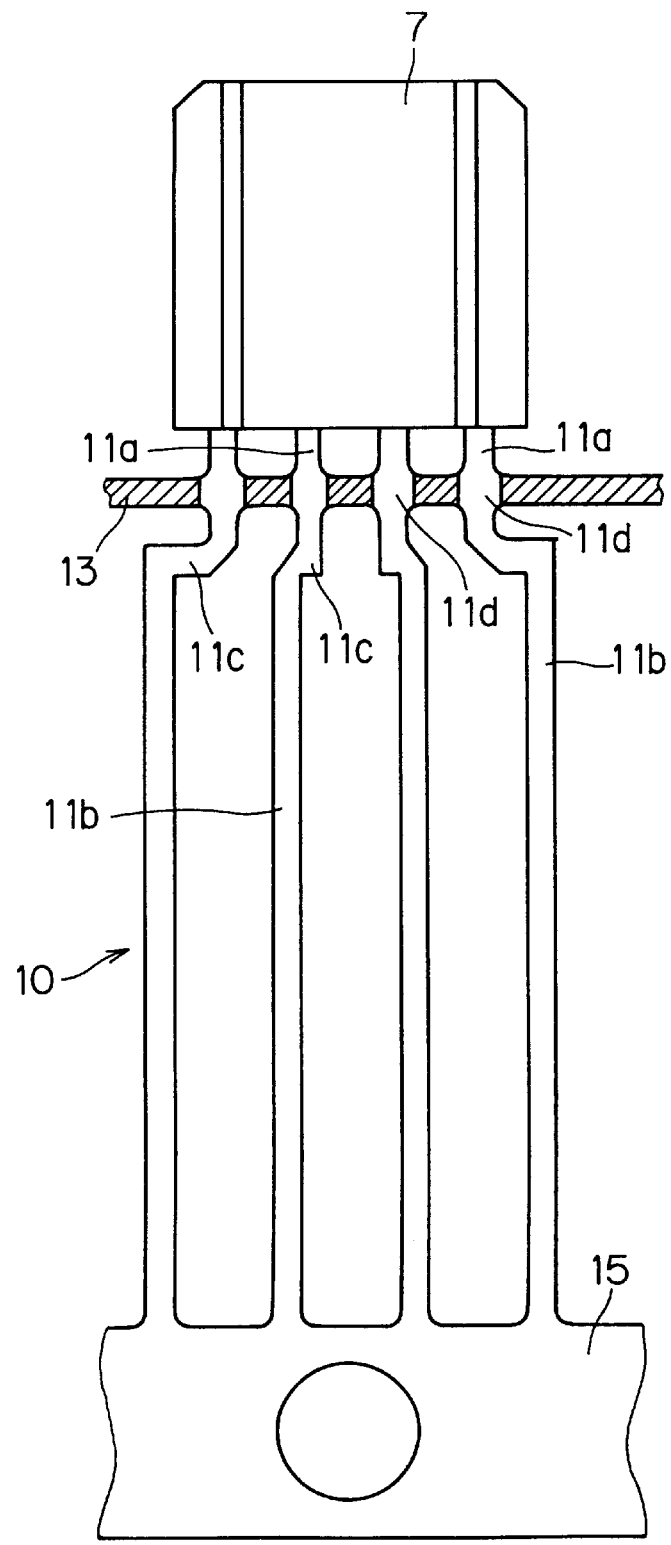
FIG. 3 is a diagram showing the same part of the leadframe as in FIG. 2 in its state after the formation of a resin mold that encloses the island together with the portion surrounding it.

FIG. 2 shows an enlarged view of a part of the leadframe 1 that corresponds to one semiconductor device, and FIG. 3 shows the same part in its state after the formation of a resin mold 7. As shown in FIG. 2, one of the four leads 10 has its tip-side end made wider so that this portion is used as an island 14 for mounting a semiconductor chip; the other leads have their tip-side ends placed in the vicinity of the island 14. Those portions 12 of the leads 10 which are shown above the broken line in FIG. 2 are inner leads that are eventually enclosed in the resin mold 7 shown in FIG. 3, and their portions 11 which are shown below the broken line are outer leads that are eventually left outside the resin mold 7.

Although not shown in the figures, four terminals including input/output terminals are provided in the semiconductor chip that is mounted on the island 14. One of those terminals is exposed as the bottom surface of the chip, and the remaining three are connected to three bonding pads formed on the top surface of the chip. The semiconductor chip is fixed to the island 14 firmly with conductive adhesive, and the bonding pads are connected to the inner leads 12 with, for example, gold wires. In this way, the four terminals are electrically connected to different ones of the leads 10.

The island 14 may be formed at the tip-side end of any of the four leads 10. Moreover, the wires may be connected to the inner leads 12 at any position on the latter. These are determined in accordance with the positions of the bonding pads of the semiconductor chip so that wire bonding can be performed most easily. In particular, the positions of connection to the inner leads 12 should preferably be determined in consideration of the direction of resin injection so that, when the resin mold is formed, the resin can be injected without damaging the wires.

The leadframe 1 can be used also with a semiconductor chip that has only three terminals that are connected to bonding pads formed on its top surface, that is, a semiconductor chip whose bottom surface does not need to be connected to one of the leads 10. In that case, the lead connected to the island 14 serves simply as a supporting member for supporting the island 14 until the resin mold 7 is formed. Accordingly, in such a case, the semiconductor chip may be fixed on the island not with conductive adhesive but with non-conductive adhesive, and the outer lead 11 connected to the island 14 is cut away later.

The leadframe 1 can be used also with a semiconductor chip that has four bonding pads on its top surface and that has all the four terminals connected to the bonding pads. In that case, the semiconductor chip is fixed on the island 14 with conductive or non-conductive adhesive, and one of the bonding pads is connected with a wire to the lead that leads to the island 14. Naturally, this lead is retained after the formation of the resin mold 7.

The island 14 is approximately square-shaped, and has projections 14a and 14b formed in two side edges that are parallel to the inner leads 12. The size of the island 14 excluding these projections 14a and 14b is set to a minimum that is required to mount the semiconductor chip. The projections 14a and 14b are both formed near the side edge that is opposite to the side edge that leads to the lead.

One projection 14a is straight and has one side edge formed continuously with a side edge of the island 14. The other projection 14b is so bent as to eventually point in a direction that goes away from the leads 10. The projection 14a and the tip-side portion of the projection 14b are used as a portion that is pressed down with a pin when the semiconductor chip is fixed on the island 14 and/or is wire-bonded. The base-side portion of the projection 14b may be used as a portion that is connected to a wire.

Of the four inner leads 12, the two outside ones extend close to the projection 14a or 14b, and are formed along those side edges of the island 14 where the projections 14a and 14b are formed. By forming the inner leads 12 along the side edges of the island 14 in this way, it is possible to freely select the positions at which the wires are connected to the inner leads 12. This makes it possible to use the leadframe 1 with various semiconductor chips that have bonding pads at different positions, and also to determine the positions of connection to the wires in consideration of the direction in which resin is injected when the resin mold is formed.

The inner leads 12 are formed parallel to each other with a uniform pitch A between each other. This pitch A is set to be so small that the tip-side ends of the leads 10 are placed in sufficient vicinity to the island 14. This helps reduce the size of the resin mold 7 to a minimum required to provide sufficient protection for the semiconductor chip and the tip-side ends of the leads 10. The outer leads 11 have their portions 11a near the resin mold 7 (hereafter referred to simply as the near portions) formed along the extension lines of the inner leads 12, and they have in those portions a pitch equal to the pitch A of the inner leads 12.

On the other hand, in their portions 11b far from the resin mold 7 (hereafter referred to simply as the far portions), the outer leads 11 need to have a pitch B that is greater than the pitch A of the inner leads 12. This is to ease the mounting of the produced semiconductor device to a circuit board and to prevent short circuits that may be caused by solder during mounting. Accordingly, the outer leads 11 are given bent portions 11c at one position along their length. The distance that the outer leads 11 need to travel in their bent portions 11c to shift from their near portions 11a to their far portions 11b is greater in the outside two leads than in the inside two leads. The four outer leads 11 are so arranged as to be symmetrical left to right, and arranging the leads in that way helps equalize and thus minimize the distance that the inside two leads need to travel to shift from their near portions 11a to their far portions 11b.

All the leads 10 have their bent portions 11c formed at an equal distance from the island 14. As a result, the gap between adjacent leads is smaller in the vicinity of the bent portions 11c than elsewhere. However, the bent portions 11c, at which the gap between adjacent leads is smallest, are nevertheless designed to be wide enough to prevent solder, even if applied so profusely as to form swells, from short-circuiting adjacent leads when the semiconductor device is mounted on a circuit board. Specifically, to secure as wide gaps as possible, the side edges of the bent portions 11c that face each other are formed approximately parallel to each other but obliquely with respect to the side edges elsewhere. Since the entire leadframe 1 is formed in one step by punching or etching, it is in this way possible to eliminate variations in the intervals between the leads 10, and obtain the gaps just as designed between the bent portions 11c.

The tie-bar 13 is so formed as to join the outer leads 11 together in their portions between the island 14 and the bent portions 11c, that is, in their near portions 11a where the pitch is equal to the pitch of the inner leads 12. The tie-bar 13 is cut apart after the formation of the resin mold. Those parts of the tie-bar 13 that are cut away are indicated as hatched areas in FIG. 3. The tie-bar 13 can be cut apart parallel to the side edges of the near portions 11a of the outer leads 11 and along lines as close to the side edges as possible, and they are actually cut apart in that way. After the tie-bar 13 has been cut apart, slightly wider portions 11d remain in the near portions 11a; however, the gap between adjacent wider portions 11d is as large as or larger than the gap between adjacent bent portions 11c.

Even if solder is applied so profusely as to form swells when the semiconductor device is mounted on a circuit board, the portions 11d that remain after the cutting-apart of the tie-bar, as well as the bent portions 11c, are never brought into contact with each other, and thus short circuits between the leads on the circuit board are prevented.

Cutting apart the tie-bar 13 parallel to the side edges of the leads 10 eliminates the need for extremely accurate positioning of the blade of the cutting machine relative to the leadframe 1. For example, even if the blade is slightly misplaced in the direction along the leads 10 (i.e. vertically in FIG. 3), the positions at which the tie-bar is cut apart are not affected at all, and therefore it is possible to cut away the length as designed of the tie-bar 13 and thus obtain the gap as designed between the portions 11d. On the other hand, even if the blade is slightly misplaced in the direction perpendicular to the leads 10 (i.e. horizontally in FIG. 3), all the positions at which the tie-bar is cut apart are affected equally, and therefore, also in this case, it is possible to cut away the length as designed of the tie-bar 13 and thus obtain the gap as designed between the portions 11d.

Simplification of positioning leads to a reduction in the time required to cut apart the tie-bar 13, and thus to an improvement in the productivity of semiconductor devices. In addition, it eliminates the need to produce the leadframe 1 with extremely high accuracy, and thus makes easy the production of the leadframe 1 itself.

It is preferable to form the tie-bar 13 near the middle points of the near portions 11a of the outer leads 11. This is to prevent the blade of the cutting machine from touching the resin mold 7 or the bent portions 11c during cutting. When the near portions 11a are considerably long, the tie-bar 13 can be formed anywhere in the near portions 11a as long as it is formed sufficiently away from both the resin mold 7 and the bent portions 11c.

When a number of semiconductor devices are produced at a time, first, a semiconductor chip is fixed on each island 14; next, leads 10 are wire-bonded to each semiconductor chip; then, each semiconductor chip is sealed in in a resin mold 7. Thereafter, the tie-bar 13 is cut apart as described above, and the outer leads 11 are trimmed off at an appropriate distance from the resin mold 7. To finish the semiconductor devices, the outer leads 11 are, if necessary, bent so that they run along the bottom surface of the resin mold 7.

During the fixing and/or wire-bonding of the semiconductor chip, the projections 14a and 14b are pressed with a pin against the stage on which the leadframe is placed. This is to prevent the coming-off of the tip of the island, and thus helps fix the semiconductor chip securely on the island 14 as well as connect the semiconductor chip securely to the leads 10 with the wires.

Semiconductor devices produced in this way, despite having many leads, have sufficiently wide gaps between the outer leads, and thus they can, without requiring non-conductive coatings to be formed in the portions that remain after the tie-bar is cut away and in the bent portions, prevent the leads from being brought into contact with each other, causing short circuits, when the semiconductor devices are mounted on a circuit board. The semiconductor device can be mounted on a circuit board and connected to the wiring pattern formed thereon not only through soldering by hand, but also by any more efficient soldering method such as dip soldering and flow soldering.

As shown in FIG. 2, the lateral width of the island 14 including the projections 14a and 14b, i.e. the length of the island 14 in the direction perpendicular to the inner leads 12 (in the horizontal direction in FIG. 2), is set to be approximately equal to the distance between the two outermost inner leads 12. On the other hand, the length of the island 14 in the direction parallel to the inner leads 12 (in the vertical direction in FIG. 2) is set to a minimum that is required to mount the semiconductor chip. As a result, it is possible to make the resin mold 7 compact, and thus minimize the size of the produced semiconductor device.

Figure 4:
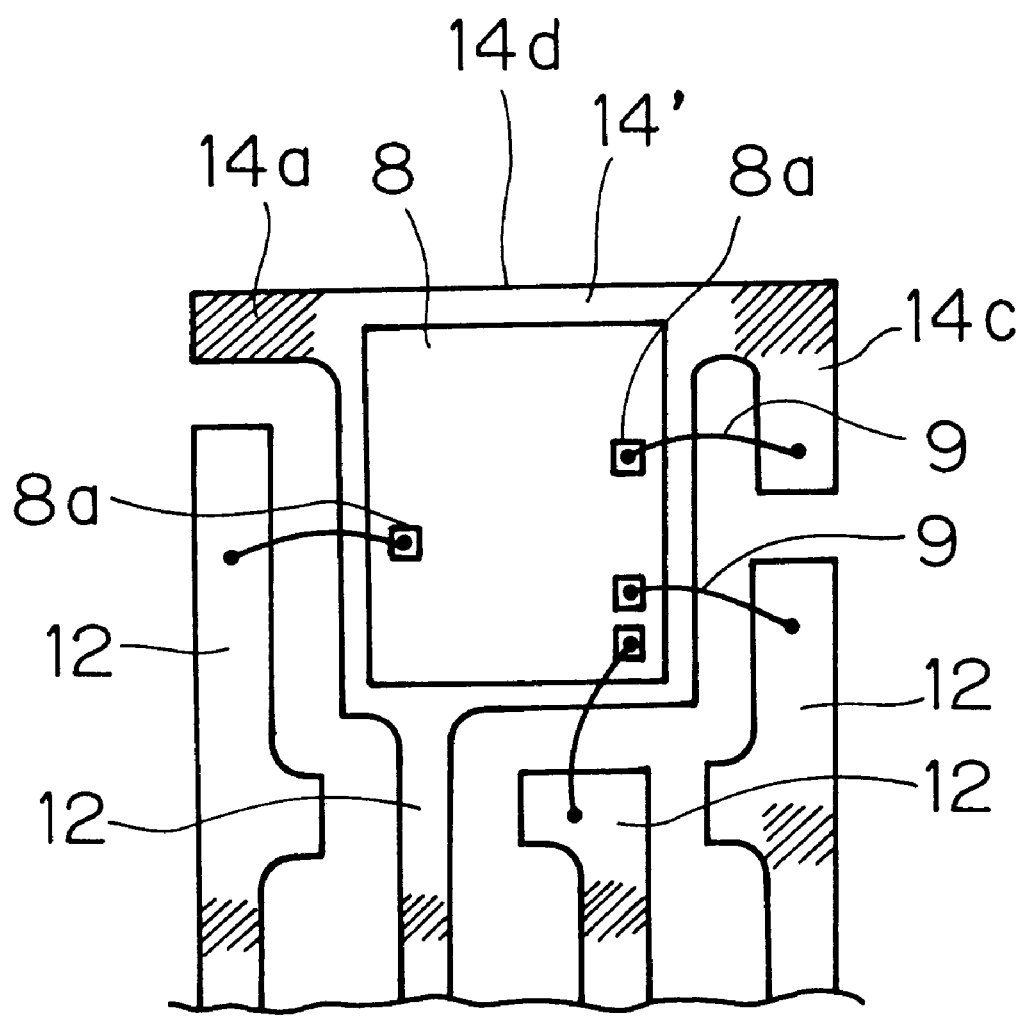
FIG. 4 is a diagram showing a part of a leadframe whose island has a partially modified shape.
Figure 5:
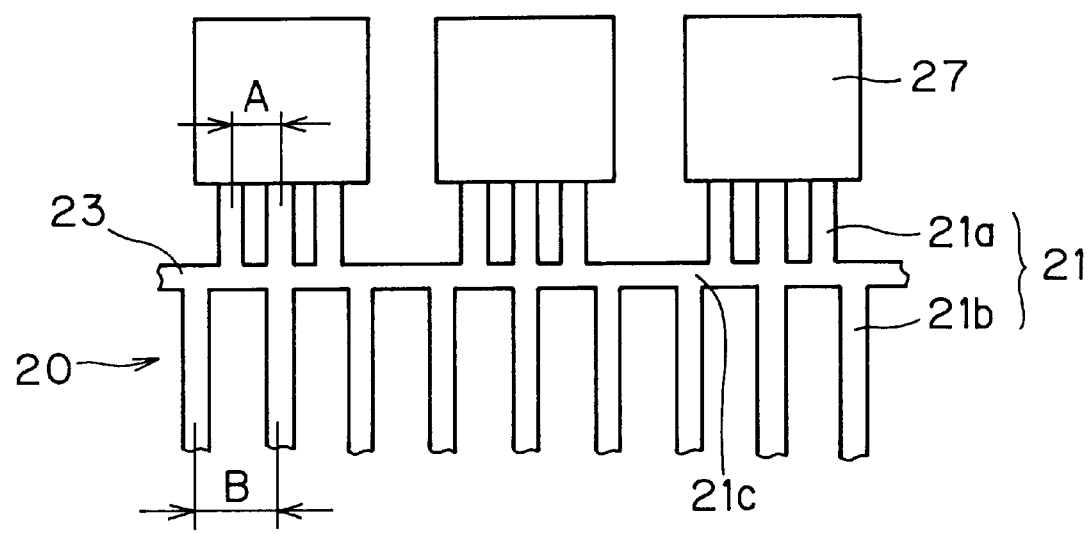
FIG. 5 is a diagram showing an example of a conventional leadframe in its state after the formation of resin molds.
Figure 6:
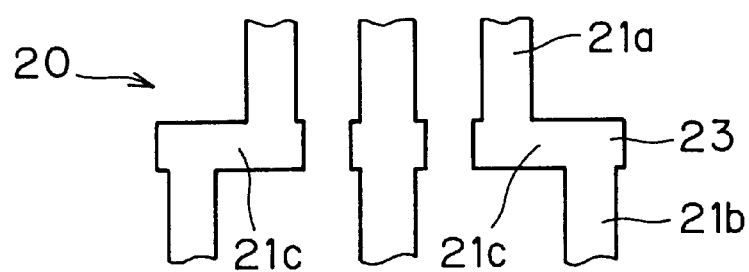
FIG. 6 is a diagram showing the leads of the leadframe shown in FIG. 5 after the tie-bar has been cut apart.
Figure 7:
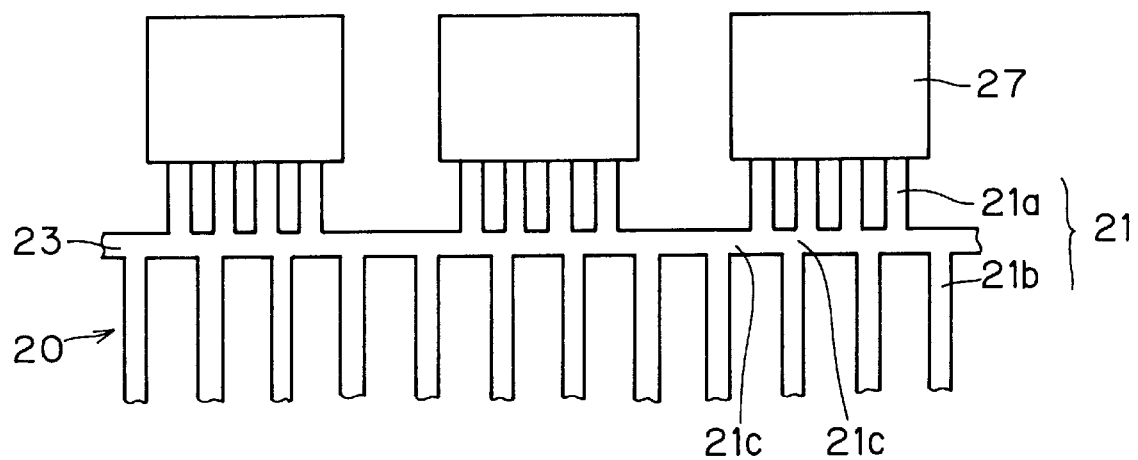
FIG. 7 is a diagram showing another example of a conventional leadframe in its state after the formation of resin molds.
Figure 8:
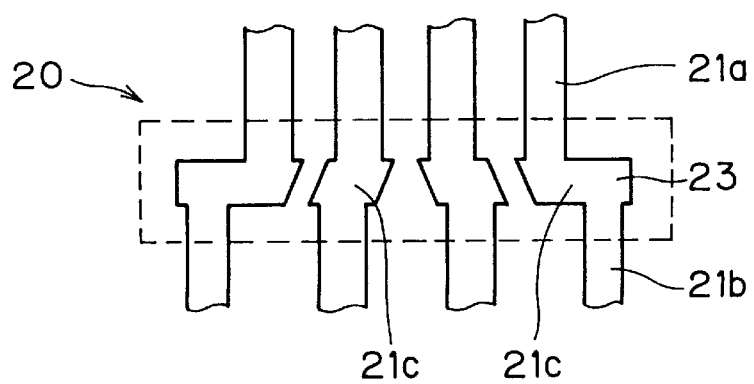
FIG. 8 is a diagram showing the leads of the leadframe shown in FIG. 7 after the tie-bar has been cut apart.
Figure 9:
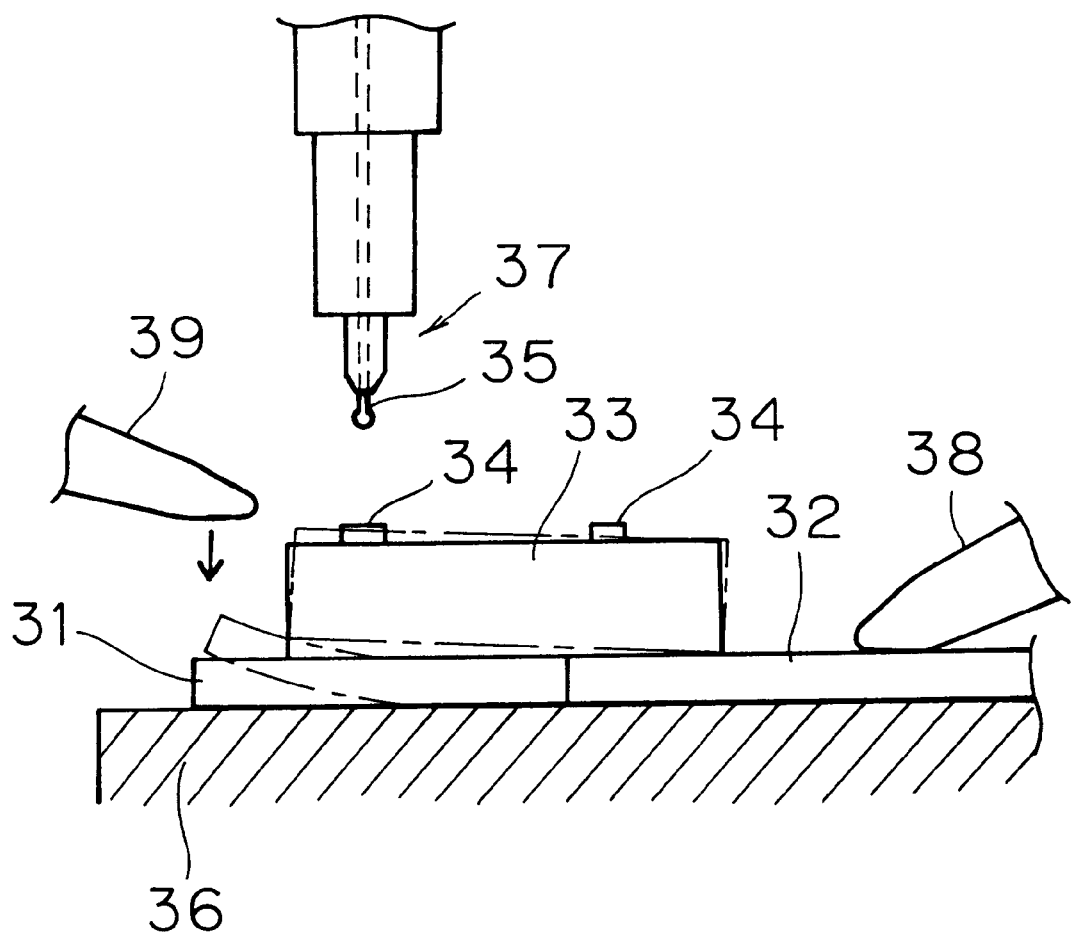
FIG. 9 is a diagram showing a side view of the island during wire-bonding.

FIG. 4 shows an island 14' that has a partially modified shape, in its state fitted with the semiconductor chip 8. The other parts of a leadframe having this island 14' are constructed in the same manner as in the leadframe 1 described above, and therefore overlapping explanations will not be repeated. The island 14' has, instead of the projection 14b of the island 14 of the leadframe 1, a projection 14c. The projection 14c is so bent as to eventually point in the direction that approaches the inner leads 12. The projection 14c has one side edge of its base-side portion formed on the extension line of the side edge 14d of the island 14' and formed continuously with the side edge 14d.

Numeral 8a represents bonding pads formed on the top surface of the semiconductor chip 8, and numeral 9 represents wires that connect the bonding pads 8a to the inner leads 12 and to the tip-side portion of the projection 14c. For example, this semiconductor chip 8 is a photoelectric IC having four terminals, and all the terminals are connected to the bonding pads 8a on the top surface. Of these four bonding pads 8a, one is connected to the tip-side portion of the projection 14c, and the other three are connected to different ones of the inner leads 12.

In FIG. 4, the hatched areas indicate the portions that are pressed down by a pin during the fixing and wire-bonding of the semiconductor chip 8. When the base-side portion of the projection 14c is formed continuously with the tip of the island 14' in this way, it is no longer necessary to position the pin extremely accurately relative to the island 14' in the lateral direction (in the horizontal direction in FIG. 4). As a result, the fixing and wire-bonding of the semiconductor chip becomes accordingly easier.

When the tip-side portion of the projection 14c is connected with a wire to the bonding pad 8a on the top surface of the semiconductor chip 8, the coming-off of the island more likely causes imperfect connection of the wire. However, since wire-bonding is performed with the projections 14a and 14c pressed down as in the present invention, it is possible to apply the supersonic wave properly and thereby connect the wire securely.

Although the above descriptions deal only with a leadframe for fitting semiconductor chips with four leads each, the present invention is applicable also to leadframes for fitting semiconductor chips with more leads each. The length of those parts of the tie-bar which are cut away depends on the gap between the inner leads, that is, it does not depend on the gap between the bent portions. Accordingly, the leadframe according to the present invention invariably serves to prevent short circuits even in cases where a number of leads are involved. As described above, it is preferable that the outer leads be so formed as to be symmetrical left to right, and, when an odd number of leads are fitted to the semiconductor chip, it is preferable that the lead in the middle be formed without bends, that is, so as to be linear.

In the embodiment described above, the bent portions of all the leads are formed approximately at an equal distance from the island. This is to prevent the outer leads from becoming unduly long. In cases where the outer leads are allowed to be considerably long, it is possible to form the bent portions at different distances from the island. In that case, wider gaps are obtained between the bent portions of adjacent leads, and therefore it is possible, even in the production of semiconductor devices having a number of leads, to prevent short circuits without fail. In addition, since the distance between the island and the tie-bar remains uniform, it is even then as easy to cut apart the tie-bar as in cases where only a smaller number of leads are involved.

It is preferable that the outer leads be arranged, in their portions farther from the island, with a fixed pitch so that the wiring pattern on a circuit board can be formed with a fixed pitch. However, the pitch of the former may be varied in accordance with the pitch of the latter. On the other hand, it is not necessary to use a fixed pitch in arranging the inner leads and, as their extensions, those potions of the outer leads which are nearer to the island, and therefore the pitch there may be varied from gap to gap depending on the positions of the bonding pads formed on the semiconductor chip. However, to allow the tie-bar to be cut apart easily, these portions be formed parallel or close to parallel to each other.

As described above, the leadframe according to the present invention permits the tie-bar to be cut apart parallel to the side edges of the leads and thus allows it to be cut apart easily. In addition, those parts of the tie-bar which come between the leads can be removed almost completely, and therefore it is possible to secure as wide gaps as possible between the leads, with the result that adjacent leads are rarely pressed into contact with each other by external force. Thus, when the produced semiconductor device is mounted on a circuit board, a short circuit rarely occurs.

On the other hand, the method of manufacturing a semiconductor device according to the present invention makes it possible to manufacture easily and efficiently such semiconductor devices that rarely suffer from short circuits. This method is suitable in particular for the production of semiconductor devices that have a number of leads.

Moreover, in the leadframe in which a projection is provided in a side edge of the island that is parallel to the leads, the island can be placed in close contact with the stage by pressing down the projection. Thus, it is possible to carry out securely the fixing of the semiconductor chip on the island and/or the connection of wires. As a result, it is possible to produce semiconductor devices free from imperfect connections. In addition, it is possible to reduce the size of the island to a minimum that is required to mount the semiconductor chip, and thus obtain compact semiconductor devices.

In the example described above, a projection is provided in each of the two side edges of the island that are parallel to the leads, that is, two projections are provided in total. However, it is also possible to use only one projection in total, though providing two projections as in the above example will more securely prevent the coming-off of the island.

Obviously, many modifications and variations of the present invention are possible in light of the above teachings. It is therefore to be understood that within the scope of the appended claims, the invention may be practiced other than as specifically described.

What is claimed is:

1. A leadframe comprising an island for mounting a semiconductor chip, a plurality of leads that have one end connected to or placed close to said island and that are arranged, in a first region nearer to said island, approximately parallel to each other with a first pitch between each other and, in a second region adjacent to said first region and farther from said island, approximately parallel to each other and with a second pitch greater than said first pitch between each other, a base-bar that joins said plurality of leads together at another end of each lead, and a tie-bar, other than said base-bar, for joining said plurality of leads together, wherein said tie-bar exists only in said first region.

2. A leadframe as claimed in claim 1,
wherein the pitch with which said plurality of leads are arranged in said first region is approximately uniform.

3. A leadframe as claimed in claim 1,
wherein the pitch with which said plurality of leads are arranged in said second region is approximately uniform.

4. A leadframe as claimed in claim 1,
wherein a borderline between said first and second regions is approximately perpendicular to said plurality of leads and said plurality of leads are bent on said borderline.

5. A leadframe as claimed in claim 4,
wherein said plurality of leads are so arranged as to be symmetrical with respect to a line through said island except in their portions closer to said island than said tie-bar.

6. A leadframe as claimed in claim 4,
wherein there are an odd number of said plurality of leads, of which the one in the middle is not bent.

7. A leadframe as claimed in claim 1,
wherein there are a plurality of sets each comprising an island and a plurality of leads joined together with a tie-bar.

8. A method of manufacturing a semiconductor device by use of a leadframe as claimed in claim 1, comprising the steps of:
fixing a semiconductor chip that has bonding pads for input or output on its top surface on said island;
connecting island-side ends of said plurality of leads, except the one that is connected to said island, to said bonding pads with wires;
sealing in said semiconductor chip, said island, and the island-side ends of said plurality of leads in a resin mold; and
removing those portions of said tie-bar which come between said plurality of leads by cutting them apart parallel to side edges of said plurality of leads.

9. A method of manufacturing a semiconductor device as claimed in claim 8,
wherein said semiconductor chip is fixed on said island with conductive adhesive.

10. A method of manufacturing a semiconductor device as claimed in claim 8,
wherein said semiconductor chip is fixed on said island with non-conductive adhesive, and wherein that one of said plurality of leads which is connected to said island has its portion outside said resin mold cut away.

11. A leadframe comprising an island for mounting a semiconductor chip, at least four leads including at least two outer leads and two inner leads, wherein each lead has one end connected to or placed close to said island and that are arranged, in a first region nearer to said island, approximately parallel to each other with a first pitch between each other and, in a second region adjacent to said first region and farther from said island, approximately parallel to each other and with a second pitch greater than said first pitch between each other, wherein a borderline between said first and second regions is approximately perpendicular to said at least four leads and said at least four leads are bent on said borderline such that a distance of said outer leads being bent is greater than a distance of said inner leads being bent, and a tie-bar for joining said plurality of leads together, wherein said tie-bar joins said plurality of leads in said first region.

12. The leadframe as claimed in claim 11, wherein the pitch with which said at least four leads are arranged in said first region is approximately uniform.

13. The leadframe as claimed in claim 11, wherein the pitch with which said at least four leads are arranged in said second region is approximately uniform.

14. The leadframe as claimed in claim 11, wherein a borderline between said first and second regions is approximately perpendicular to said at least four leads and said at least four leads are bent on said borderline.

15. The leadframe as claimed in claim 11, wherein said at least four leads are so arranged as to be symmetrical with respect to a line through said island except in their portions closer to said island than said tie-bar.

16. The leadframe as claimed in claim 11, wherein the at least two inner leads in the middle are not bent.

17. The leadframe as claimed in claim 11, further comprising:

a plurality of sets, each set comprising an island and a plurality of leads joined together by a tie-bar.

18. A method of manufacturing a semiconductor device by use of a leadframe as claimed in claim 11, comprising the steps of:

fixing a semiconductor chip that has bonding pads for input or output on its top surface on said island;

connecting island-side ends of said at least four leads, except one of the at least two inner leads that is connected to said island, to said bonding pads with wires;

sealing in said semiconductor chip, said island, and the island-side ends of said at least four leads in a resin mold; and removing those portions of said tie-bar which come between said at least four leads by cutting them apart parallel to side edges of said at least four leads.

19. The method as claimed in claim 18, wherein said semiconductor chip is fixed on said island with conductive adhesive.

20. The method as claimed in claim 18, wherein said semiconductor chip is fixed on said island with non-conductive adhesive, and wherein that one of said at least two inner leads which is connected to said island has its portion outside said resin mold cut away.

* * * * *